(12) United States Patent
Carter et al.

(10) Patent No.: US 7,500,380 B2
(45) Date of Patent: *Mar. 10, 2009

(54) MEASURING DISTANCE USING GAS GAUGE PROXIMITY SENSOR

(75) Inventors: Frederick Michael Carter, New Milford, CT (US); Peter Kochersperger, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/396,908

(22) Filed: Apr. 4, 2006

(65) Prior Publication Data

US 2006/0272394 A1 Dec. 7, 2006

Related U.S. Application Data

(63) Continuation of application No. 10/833,249, filed on Apr. 28, 2004, now Pat. No. 7,021,120.

(51) Int. Cl.
*G01B 13/08* (2006.01)

(52) U.S. Cl. ........................................... 73/37.5

(58) Field of Classification Search .......... 73/37.5–37.8
See application file for complete search history.

(56) References Cited

U.S. PATENT DOCUMENTS

| | | | |
|---|---|---|---|
| 2,707,389 A | 5/1955 | Fortier | |
| 3,213,670 A | 10/1965 | MacGeorge | |
| 3,243,992 A | 4/1966 | Woods | |
| 3,477,276 A | 11/1969 | Fortier | |
| 3,511,081 A | 5/1970 | Whitney et al. | |
| 3,520,175 A | 7/1970 | Sharp et al. | |
| 3,535,916 A | 10/1970 | Adams | |
| 3,709,027 A | 1/1973 | Beeken | |
| 3,710,421 A | 1/1973 | Tooka | |
| 3,712,318 A | 1/1973 | Kopera | |
| 3,877,485 A | 4/1975 | Wojcikowshi | |
| 3,894,423 A | 7/1975 | Messmer | |
| 3,894,552 A | 7/1975 | Bowditch | |
| 4,142,401 A | 3/1979 | Wilson | |
| 4,292,838 A | 10/1981 | Larsen | |

(Continued)

FOREIGN PATENT DOCUMENTS

JP 50-055465 A 5/1975

(Continued)

*Primary Examiner*—Hezron E. Williams
*Assistant Examiner*—John Fitzgerald
(74) *Attorney, Agent, or Firm*—Sterne, Kessler, Goldstein & Fox P.L.L.C.

(57) ABSTRACT

In a gas gauge, effects due to changes in the local environment are reduced by causing a measurement nozzle and a reference nozzle to react as if they were co-located, or located at approximately the same position. This is achieved by venting the reference nozzle in very close proximity to the measurement nozzle. A reference chamber surrounding the reference plate and reference nozzle is vented at approximately the same location as the measurement nozzle. In an embodiment for use in a vacuum environment, the measurement nozzle is surrounded with an annular ring. The measurement annular ring is connected to an annular ring around the reference nozzle, which acts to co-locate the reference nozzle and the measurement nozzle. To avoid choked flow, another annular ring or rings may be placed around the measurement annular ring.

8 Claims, 7 Drawing Sheets

U.S. PATENT DOCUMENTS

| | | |
|---|---|---|
| 4,434,649 A | 3/1984 | Williams |
| 4,550,592 A | 11/1985 | Dechape |
| 4,679,423 A | 7/1987 | Ballentine |
| 4,809,527 A | 3/1989 | Mitchell |
| 4,854,156 A | 8/1989 | Hoeffel et al. |
| 4,953,388 A | 9/1990 | Barada |
| 5,087,927 A | 2/1992 | Thomas et al. |
| 5,243,849 A | 9/1993 | Williams |
| 5,317,898 A | 6/1994 | Nemeth |
| 5,616,853 A | 4/1997 | Oshumi |
| 5,789,661 A | 8/1998 | Fauque et al. |
| 6,318,153 B1 | 11/2001 | Dumberger et al. |
| 6,807,845 B2 | 10/2004 | Halbinger et al. |
| 7,021,120 B2 * | 4/2006 | Carter et al. .................. 73/37.5 |
| 7,134,321 B2 * | 11/2006 | Galburt et al. ............... 73/37.5 |

FOREIGN PATENT DOCUMENTS

| | | |
|---|---|---|
| JP | 56087805 | 7/1981 |
| JP | 2-232507 A | 9/1990 |

* cited by examiner

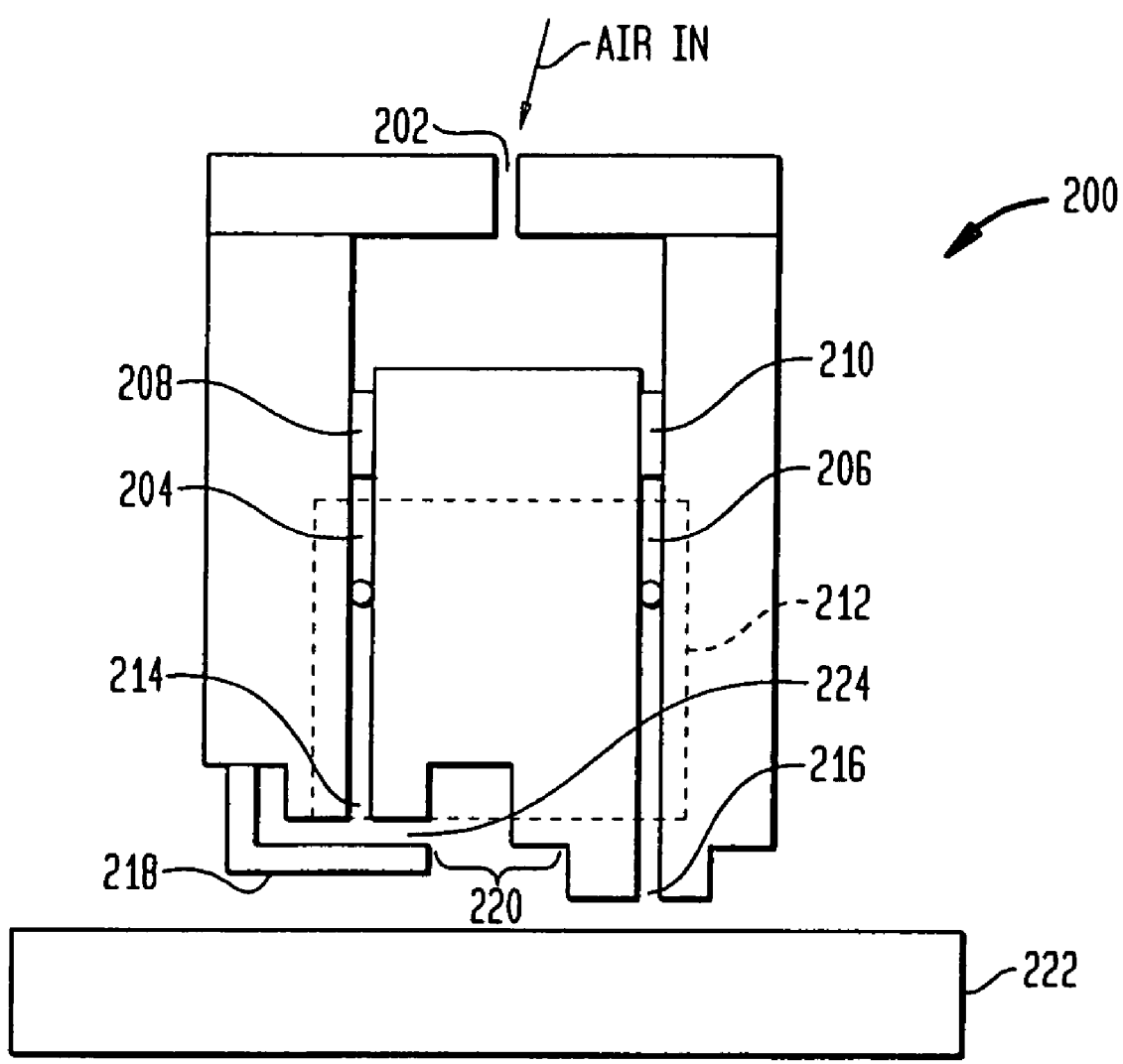

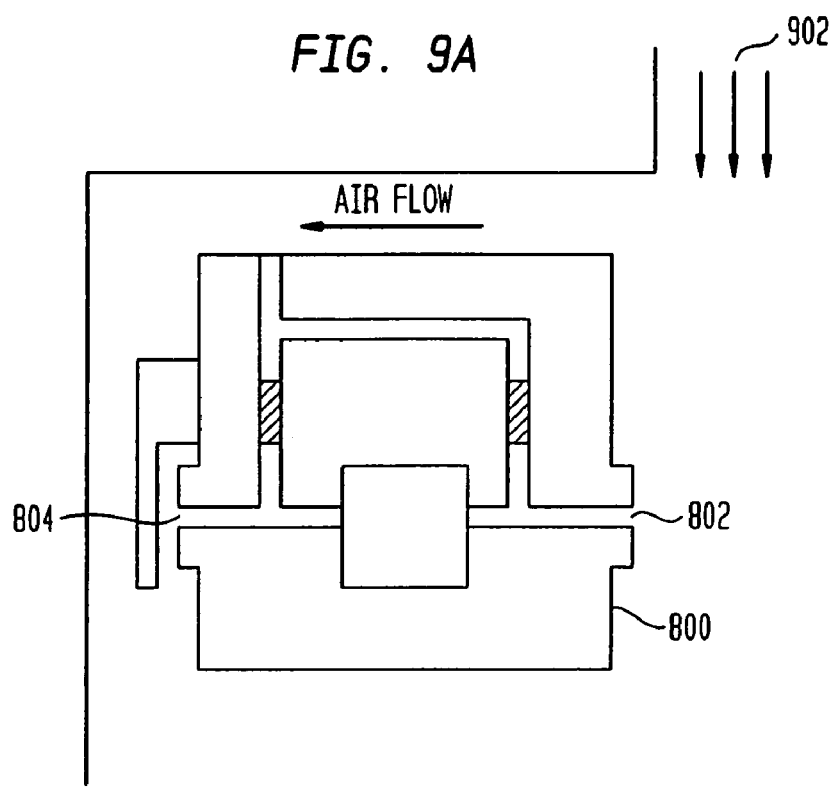
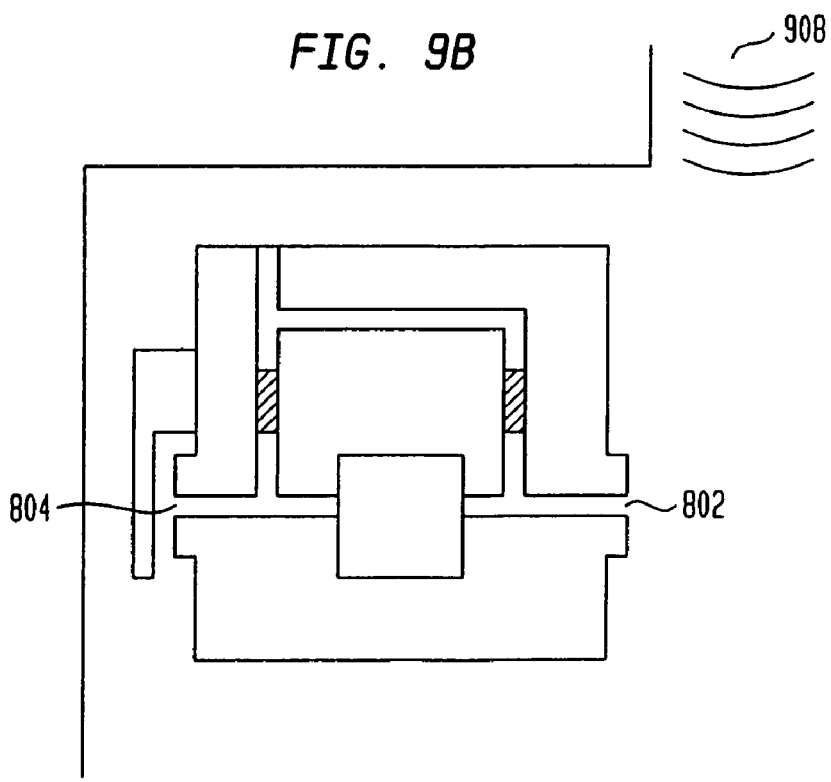

MEASURING DISTANCE USING GAS GAUGE PROXIMITY SENSOR

CROSS REFERENCE TO RELATED APPLICATIONS

This application is a continuation of U.S. application Ser. No. 10/833,249, filed Apr. 28, 2004, (that issued as U.S. Pat. No. 7,021,120), which is herein incorporated by reference in its entirety.

BACKGROUND OF THE INVENTION

1. Field of the Invention

This invention relates to the field of gas gauges for use in vacuum or ambient environments.

2. Related Art

A typical air gauge is very sensitive to environmental effects, such as the pressure, humidity, and temperature of the air. One method of canceling out these effects is to use a reference nozzle and a measurement nozzle. The measurement nozzle uses air flow pressure differences to measure a distance between the nozzle and a surface. For example, the surface may be a semiconductor wafer or LCD panel. The reference nozzle discharges air toward a reference plate. The surface of the reference plate is located at a pre-determined distance from the reference nozzle. The distance of the measurement nozzle to the surface can be determined by comparing the difference between the reference air flow pressure and the measurement airflow pressure.

If the properties of environmental effects are uniform over a large area, or if the measurement is low-resolution so that minor fluctuations in the environment do not affect the measurement, the same environment should exist at both the reference and measurement nozzles. These effects can be canceled out relatively easily. However, this process becomes ineffective when high-resolution measurements, such as those on the order of nanometers, are required. When a small measurement is needed, local environmental differences between the measurement nozzle and the reference nozzle significantly affect the measurements, even when the nozzles are only a centimeter or two apart. If the environmental differences are variable and changing with time, a variable offset results that causes an unpredictable measurement error.

For example, if there is a net air flow from one nozzle to the other, a pressure difference exists between the two. If that air flow changes, the pressure difference changes, resulting in an inaccurate measurement.

Measurement errors resulting from variable environments are not predictable. This is important in many applications, such as lithography. In lithography, movement of a wafer stage to different positions dramatically affects the local air flow. Thus, offset caused by pressure differences is motion or velocity dependent rather than fixed on the wafer. What is needed is a gauge that remains unaffected by changes in the local environment.

SUMMARY OF THE INVENTION

The present invention reduces the problem of changes in the local environment by causing the measurement nozzle and the reference nozzle to react as if they were co-located, or located at approximately the same position. This is achieved by venting the reference nozzle in very close proximity to the measurement nozzle.

In the present invention, a reference plate, located at a distance from the reference nozzle, acts to close in the reference nozzle and create a reference chamber. The reference chamber is vented through a reference vent. The reference vent is located in approximately the same location as the measurement nozzle. Because of the vent, any environmental changes, such as pressure, outside the vent will affect the reference nozzle. Since the vent is located at approximately the same position as the measurement nozzle, environmental changes outside the vent will affect the measurement nozzle and the reference nozzle in substantially the same way. In this manner, the reference nozzle and the measurement nozzle react to local environmental effects as if they are co-located.

The present invention may also be used where the ambient environment is a vacuum. In a vacuum, gas exiting the measurement nozzle may be stripped away by the vacuum before accurate measurements can be made. Here, the measurement nozzle is surrounded with an annular ring. The reference chamber also forms an annular ring around the reference nozzle. The annular ring around the reference nozzle is connected to the annular ring around the measurement nozzle. The reference annular ring and the measurement annular ring act to co-locate the reference nozzle and the measurement nozzle. To avoid choked flow, another annular ring may be placed around the measurement annular ring. In this case, choked flow conditions occur between the outer annular ring and the vacuum, away from where the measurements are taking place.

A series of annular rings may surround the measurement annular ring, so that the pressure is stepped down in increments from the measurement pressure to the vacuum.

Gas inlets and outlets from the annular rings act to inject additional gas as needed, or remove excess gas from the annular rings. This additional gas could be injected or removed based on algorithms executed on a computer. The algorithm could be based on experimental or computational fluid dynamics models. The algorithms may use feedback based on internal gauge sensor feedback or additional sensors placed at various locations on the gauge structure. This system may operate in a closed loop feedback system.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 is a side view of an air gauge according to an embodiment of the present invention.

FIG. 9A illustrates the effect of air flow on a conventional air gauge.

FIG. 9B illustrates the effect of blower noise on a conventional air gauge.

The present invention will be described with reference to the accompanying drawings. The drawing in which an element first appears is typically indicated by the leftmost digit(s) in the corresponding reference number.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Introduction

Figure 7:
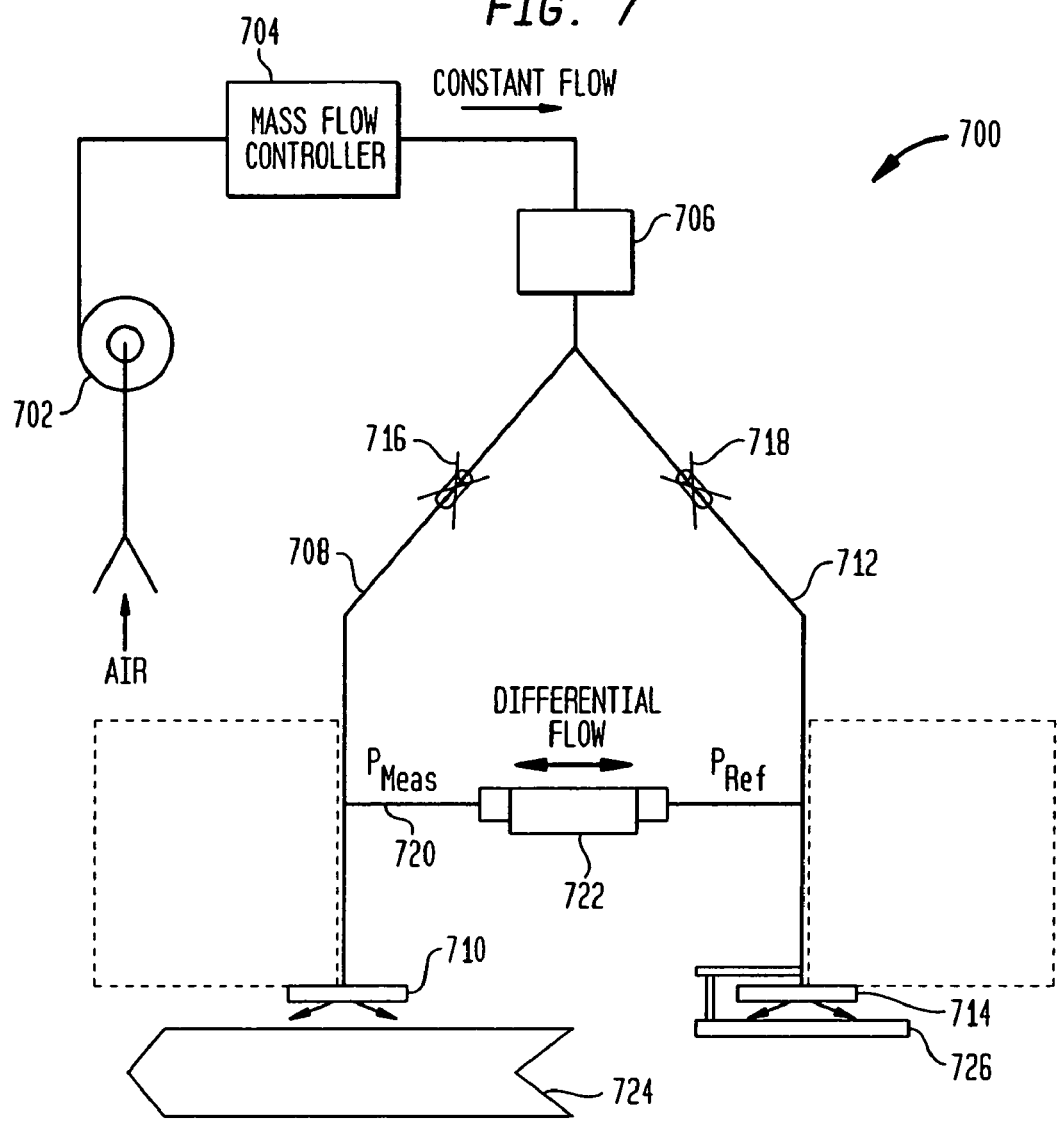
FIG. 7 is a block diagram of a conventional air gauge.

In order to understand the benefits of the present invention, it is helpful to describe a generic system, such as that found in U.S. Pat. No. 4,953,388 issued to Barada and U.S. Pat. No. 4,550,592 issued to Dechape, each of which is incorporated herein by reference in its entirety. FIG. 7 is a block diagram of a conventional air gauge 700. An air pump 702 supplies air to a mass flow controller 704. Mass flow controller 704 maintains a constant rate of air flow into air gauge 700. The air then passes through filter 706 which removes impurities from the air. After leaving filter 706, the air is divided into two channels. Channel 708 is a measurement channel, which ultimately leads to measurement nozzle 710. Channel 712 is a reference channel, which ultimately leads to reference nozzle 714. To ensure a common flow rate to measurement nozzle 710 and reference nozzle 714, flow restrictors 716 and 718 are placed in measurement channel 708 and reference channel 712, respectively. Flow restrictors 716 and 718 also have the effect of damping out upstream pressure and flow oscillations or disturbances.

Measurement channel 708 and reference channel 712 are connected via differential flow channel 720. Differential flow channel 720 includes a mass air flow sensor 722. If the pressure at measurement nozzle 710 is substantially equal to the pressure at reference nozzle 714, there is no flow across mass air flow sensor 722. However, if the distance between measurement nozzle 710 and, for example, a wafer 724 changes relative to the distance between reference nozzle 714 and reference plate 726, the pressure at the measurement nozzle will also change. This pressure differential creates a movement of air from, for example, reference channel 712 to measurement channel 708, through differential flow channel 720. This movement of air is detected by mass air flow sensor 722. Once detected, the distance between measurement nozzle 710 and wafer 724 can be measured.

Figure 8:
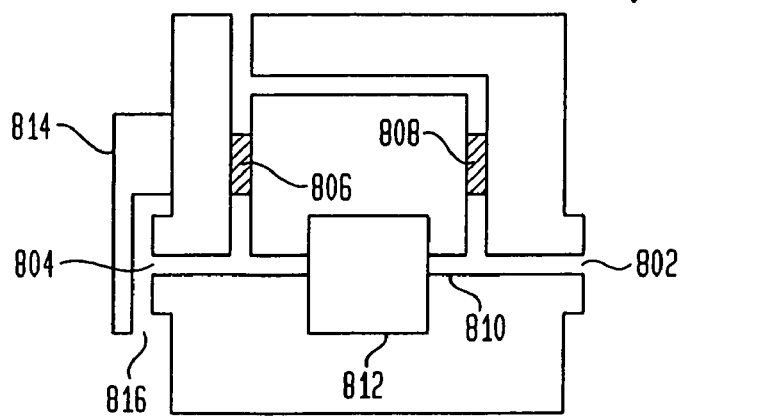
FIG. 8 is a side view of a conventional air gauge.

An alternative configuration 800 is illustrated in FIG. 8. Air enters through flow restrictors 806 and 808. Measurement nozzle 802 and reference nozzle 804 are connected via differential flow channel 810 having a mass flow sensor 812. Reference plate 814 and reference nozzle 804 create a reference gap 816.

Non-Vacuum Environment

As mentioned above, the problem with conventional air gauges is that they typically are not capable of accounting for local environmental changes on a miniscule scale. FIGS. 9A and 9B illustrate how local noise created by the air gauge itself can adversely affect a measurement. In FIG. 9A, air can enter gauge 800 closer to one nozzle than the other. For example, external air flow 902 enters gauge 800 closer to measurement nozzle 802 than reference nozzle 804. This causes a steady pressure differential between nozzles 802 and 804, which will appear as a measurement offset.

The distance between measurement nozzle 802 and reference nozzle 804 also allows the gauge to be adversely affected by noise, such as blower noise 908, shown in FIG. 9B. Since blower noise 908 impacts measurement nozzle 802 and reference nozzle 804 out of phase, a high frequency pressure differential results. This pressure differential will appear as measurement noise.

Therefore, when trying to minimize environmental differences between the reference nozzle and the measurement nozzle, it is desirable for the reference nozzle and measurement nozzle to be as close together as possible. However, structural limitations often prohibit the nozzles from being as close as is necessary. The present invention overcomes this limitation by treating the reference nozzle and the measurement nozzle as if they are co-located (located in approximately the same place). This is achieved by venting the reference nozzle in very close proximity to the measurement nozzle.

Figure 1A:
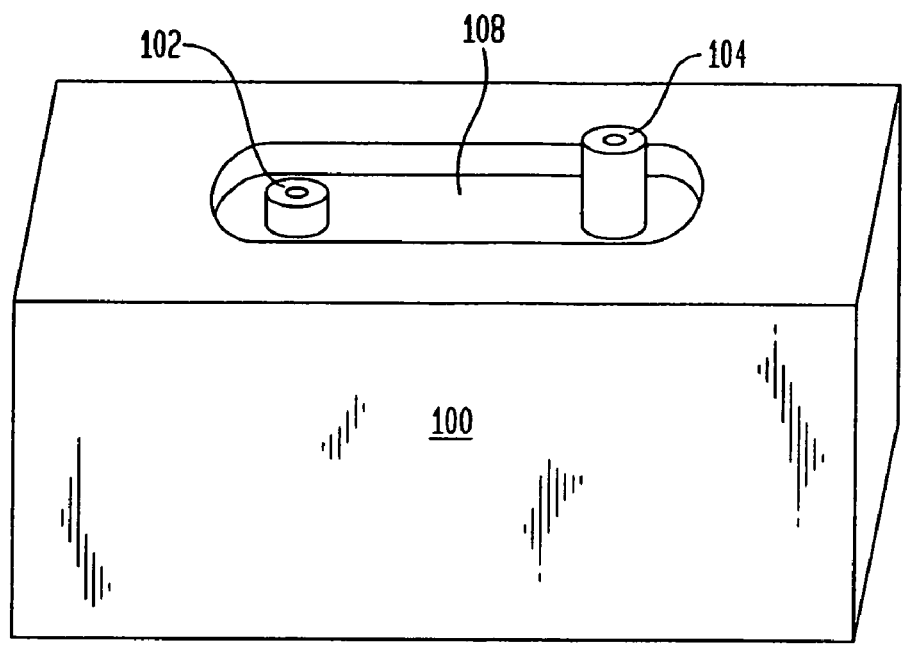
FIG. 1A is a 3-D view of an air gauge according to an embodiment of the present invention, showing a reference nozzle and a measurement nozzle.
Figure 1B:
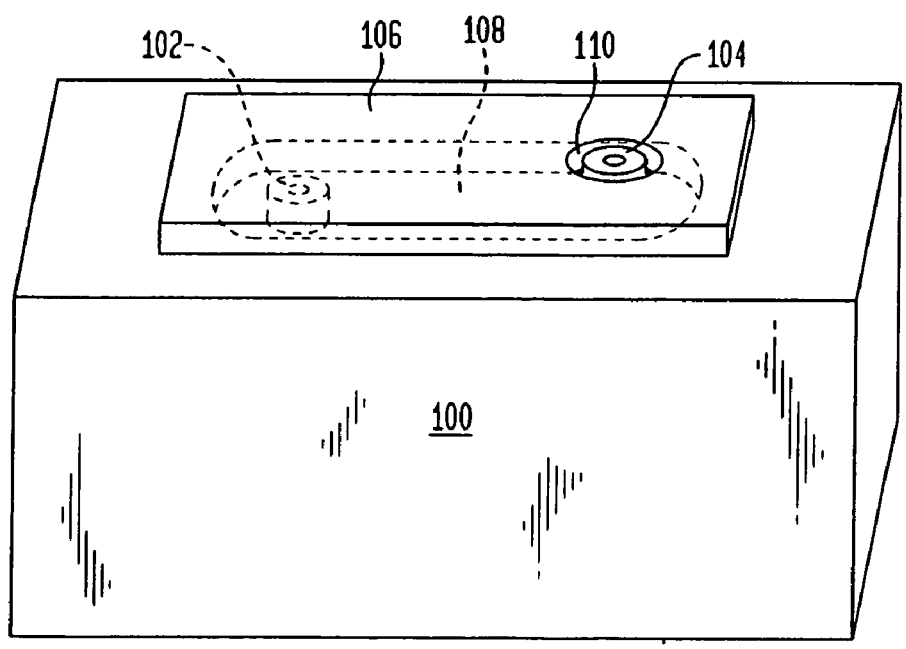
FIG. 1B is a 3-D view of an air gauge according to an embodiment of the present invention, showing placement of the reference plate.

FIGS. 1A and 1B are broad illustrations of the co-location concept according to the present invention. As shown in FIG. 1A, reference nozzle 102 of gauge 100 is located near measurement nozzle 104. Even though reference nozzle 102 is fairly close to measurement nozzle 104, local environmental differences may exist between the two nozzles. FIG. 1B illustrates how a reference plate 106 creates a reference chamber 108 (shown in broken lines) around reference nozzle 102. Reference chamber 108 is vented at reference vent 110. Reference vent 110 opens at approximately the same location as measurement nozzle 104. Since reference plate 106 inhibits air flow within reference chamber 108, the pressure within reference chamber 108 is substantially identical to the pressure at measurement nozzle 104. Likewise, the pressure at reference nozzle 102 is also substantially identical to the pressure at measurement nozzle 104. In this manner, reference nozzle 102 and measurement nozzle 104 react as though they are co-located. This reduces and/or eliminates the measurement offset and noise caused by external air flow and pressure changes.

FIG. 2 further illustrates the concept of co-location. Gas enters gas gauge 200 at inlet 202. The gas is split into reference channel 204 and measurement channel 206 via flow restrictors 208 and 210, respectively. Gas is directed from measurement nozzle 216 toward a surface 222. Surface 222 may be, for example, a semiconductor wafer or LCD panel. Measurement nozzle 216 may include a nozzle-shaped tool. In another embodiment, measurement nozzle 216 is simply an opening at the end of measurement channel 206.

Gas is also directed from reference nozzle 214 toward a reference plate 218. In one embodiment, reference nozzle 214 includes a nozzle-shaped tool. In another embodiment, reference nozzle 214 is simply an opening at the end of reference channel 204.

Mass flow sensor 212 measures the gas flow between reference channel 204 and measurement channel 206. Although in the present invention, reference nozzle 214 is physically separate from measurement nozzle 216, reference plate 218 is extended so as to provide a vent to the surroundings at reference vent 220.

Vent 220 is close to measurement nozzle 216. This forms a reference chamber 224. Because the openings to measurement nozzle 216 and reference nozzle 214 (through reference chamber 224) are co-located, environmental effects at measurement nozzle 216 affect reference nozzle 214 simultaneously. For example, if blower noise or external air flows past measurement nozzle 216, reference nozzle 214 is affected as well. Since each nozzle is affected in a substantially identical manner, changes in the ambient temperature or pressure can be cancelled out.

Vacuum Environment

Figure 3:
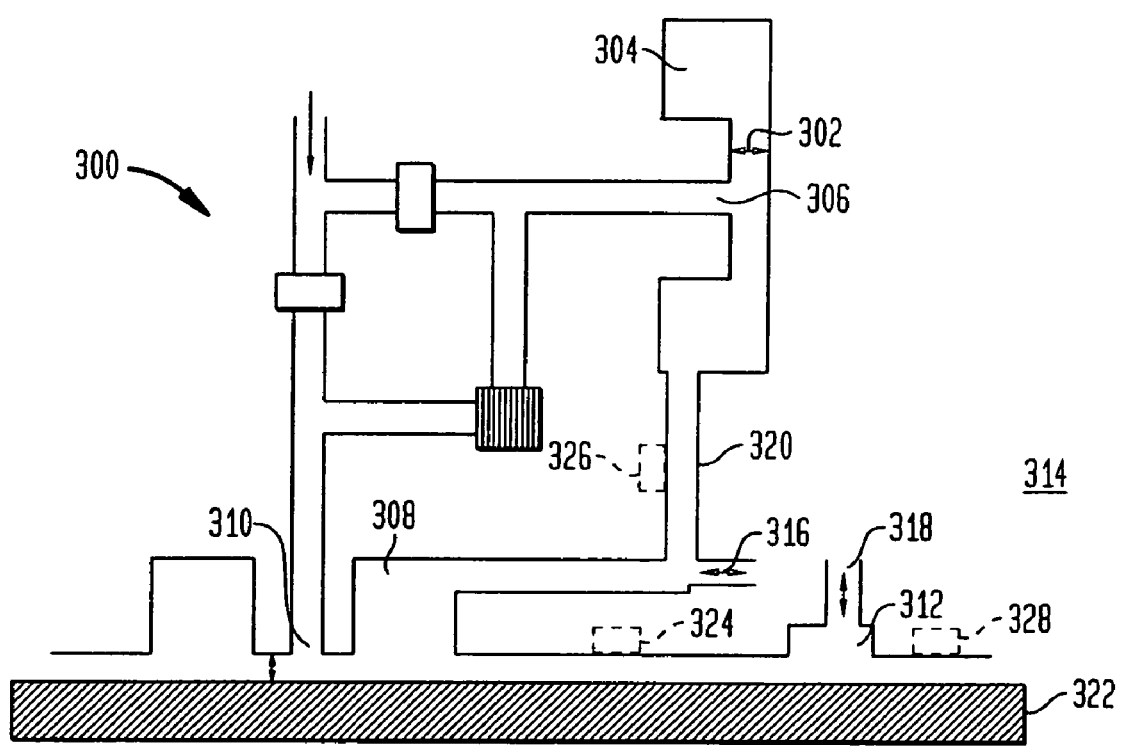
FIG. 3 is a block diagram of an air gauge according to an embodiment of the present invention.

FIG. 3 is a side view of an embodiment of the present invention that may be used in a vacuum environment. Although gauge 300, shown in FIG. 3, will be described with reference to a vacuum, one of skill in the art will recognize that gauge 300 may also be used in a non-vacuum environment.

A reference gap, or optimal distance, is shown as reference gap 302. Reference gap 302 is vented into an annular ring 304 surrounding reference nozzle 306. This forms a reference chamber. Although the annular rings will be referred to as such in the present example, a person skilled in the relevant art will recognize that an annular ring may simply be an annular volume. Annular ring 304 is connected to annular ring 308 via balance tube 320. Annular ring 308 surrounds measurement nozzle 310 and forms a measurement chamber. The volume of the reference chamber is substantially equal to the volume of the measurement chamber. Since the measurement chamber (annular ring 308) surrounds measurement nozzle 310, the pressure in the measurement chamber is approximately equal to the pressure at the measurement nozzle. Balance tube 320 maintains approximately equal pressure in the reference chamber and the measurement chamber. Thus, measurement nozzle 310 and reference nozzle 306 are subject to the same environmental pressure, and react as though they are co-located.

If a gas gauge is used in a vacuum environment, there is a significant pressure difference between the environment and the gas being blown out. The large pressure difference between the gas input and the vacuum creates a high-velocity flow and a condition called "choked flow." Choked flow occurs when the upstream flow rate cannot be increased by a reduction of downstream pressure because the flow rate is at its maximum. In other words, flow at the exit plane has reached a Mach number of unity, the maximum for isotropic flow. If this condition is reached, it will adversely affect the measurement precision at measurement nozzle 310. This is because information about conditions in the exhaust flow cannot be transmitted upstream. Therefore, measurement nozzle pressure or flow rates are not affected by further change such as volume increase due to measurement gap increase or decrease. Valuable information is thereby lost, since the sensor is trying to determine measurement gap increase or decrease. The present invention corrects for choked flow by placing another annular ring 312 around measurement nozzle 310, effectively moving the choked flow transition away from the measurement and reference nozzles. This allows a stable measurement chamber at a higher pressure than the ambient environment. For example, the pressure within annular rings 308 and 312 may be 1 psi, with a vacuum surrounding. Because of the additional annular ring 312, choked flow only occurs between annular ring 312 and vacuum 314, away from measurement nozzle 310.

Additional gas may be supplied to annular rings 308 and 312 through gas inlets 316 and 318, respectively. One reason for injecting gas into the annular rings is that some gas may leak into vacuum 314. Injecting gas through gas inlets 316 and 318 keeps the pressure within gauge 300 high enough for accurate measurements. Conversely, inlets 316 and 318 can be used as outlets for venting excess gas. For example, if a measurement pressure of 1 psi is desired, but the outer annular ring is stepped down to a pressure of 0.5 psi, gas may be vented from annular ring 312 through inlet 318.

A plurality of annular rings may be substituted for annular ring 312. This allows the pressure to drop in increments from measurement annular ring 308 to vacuum 314. Thus, the pressure can still be controlled while measurement nozzle 310 is further buffered from any choked flow. This also allows the measurement nozzle to be buffered from the resulting pressure shockwaves that occur in the exit stream as Mach flow is reached or the flow is choked, since flow cannot expand isentropically.

One or more of sensors 324, 326, and 328 may be included in gauge 300. Sensors 324, 326, and 328 may be flow sensors. Alternatively, they may be pressure sensors. One of skill in the art will recognize that any combination of pressure and flow sensors may be used. In addition, one of skill in the art will recognize that sensors similar to sensors 324, 326, and 328 may be used in other locations of gauge 300 as needed.

Figure 4:
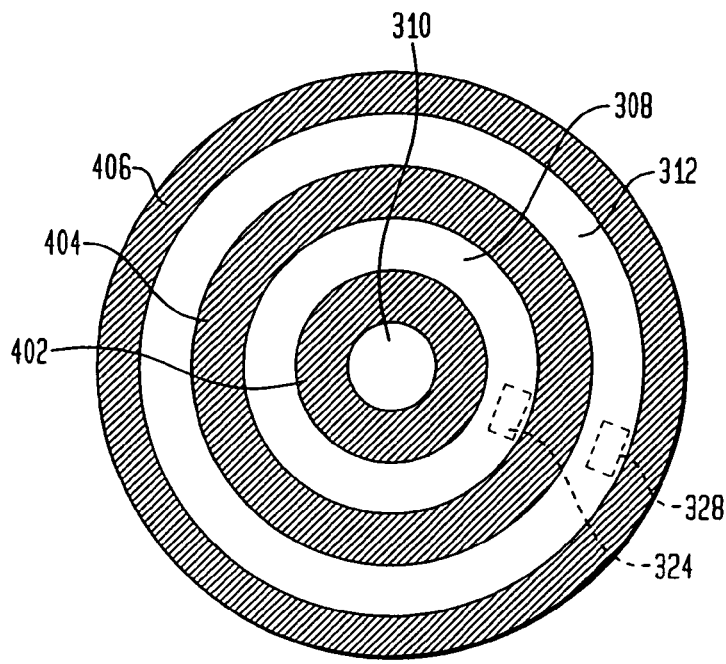
FIG. 4 is a diagram of flats of proximity for use in an air gauge according to an embodiment of the present invention.

FIG. 4 is an illustration of the annular rings according to an embodiment of the present invention. Measurement nozzle 310 is shown in the center of FIG. 4. Annular ring 308 surrounds measurement nozzle 310. Annular ring 312 surrounds annular ring 308. The shaded areas in FIG. 4 represent flats of proximity 402, 404, and 406. These are areas of, for example, gauge 300 that are very close to the measured surface 322. It is this proximity to surface 322 that gives rise to choked flow conditions between the annular rings and vacuum 314. Sensors 324 and 328 for measuring the flow and/or pressure between the annular rings are also shown.

It may be undesirable for gas from gauge 300 to be vented into vacuum 314. Thus, gas may be removed at annular ring 312 to keep the gas from leaking. Alternatively, if a specific gas does not affect the properties of the vacuum, that specific gas may be used throughout gauge 300 to minimize contamination due to leaks. In one embodiment, nitrogen is used as the measurement gas. In another embodiment, argon is the measurement gas. In yet another embodiment, the measurement gas is a combination of gases.

Figure 5:
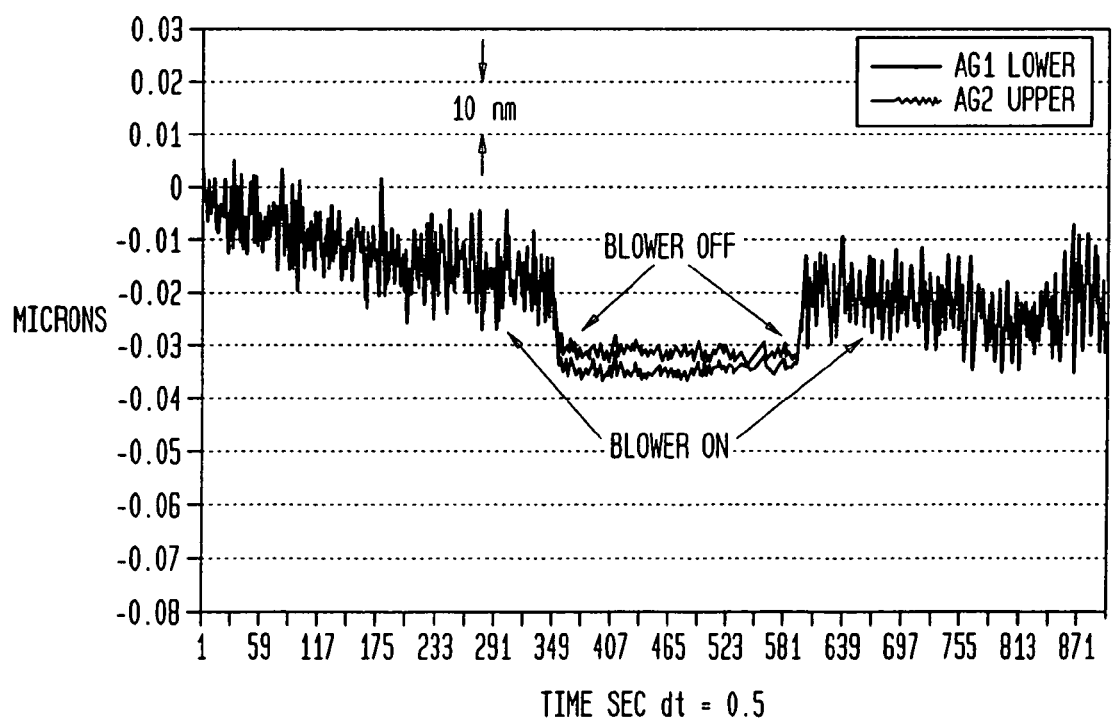
FIG. 5 is a graph showing the effect of blower noise on a conventional air gauge.

FIG. 5 is a graph depicting the effect of blower noise on a typical air gauge, such as that described with respect to FIG. 7. FIG. 5 includes results from two measurement channels, AG1 and AG2. When the air blower is turned off, as shown in area 502, the two measurement channels can be easily measured. As shown, an offset exists between times when the blower is on and times when the blower is off. This offset is caused by a blower-induced pressure difference between the measurement nozzle and the reference nozzle. Further, when the air blower is turned on, as shown in areas 504 and 506, so much noise is added to the system that an accurate measurement cannot be made.

Figure 6:
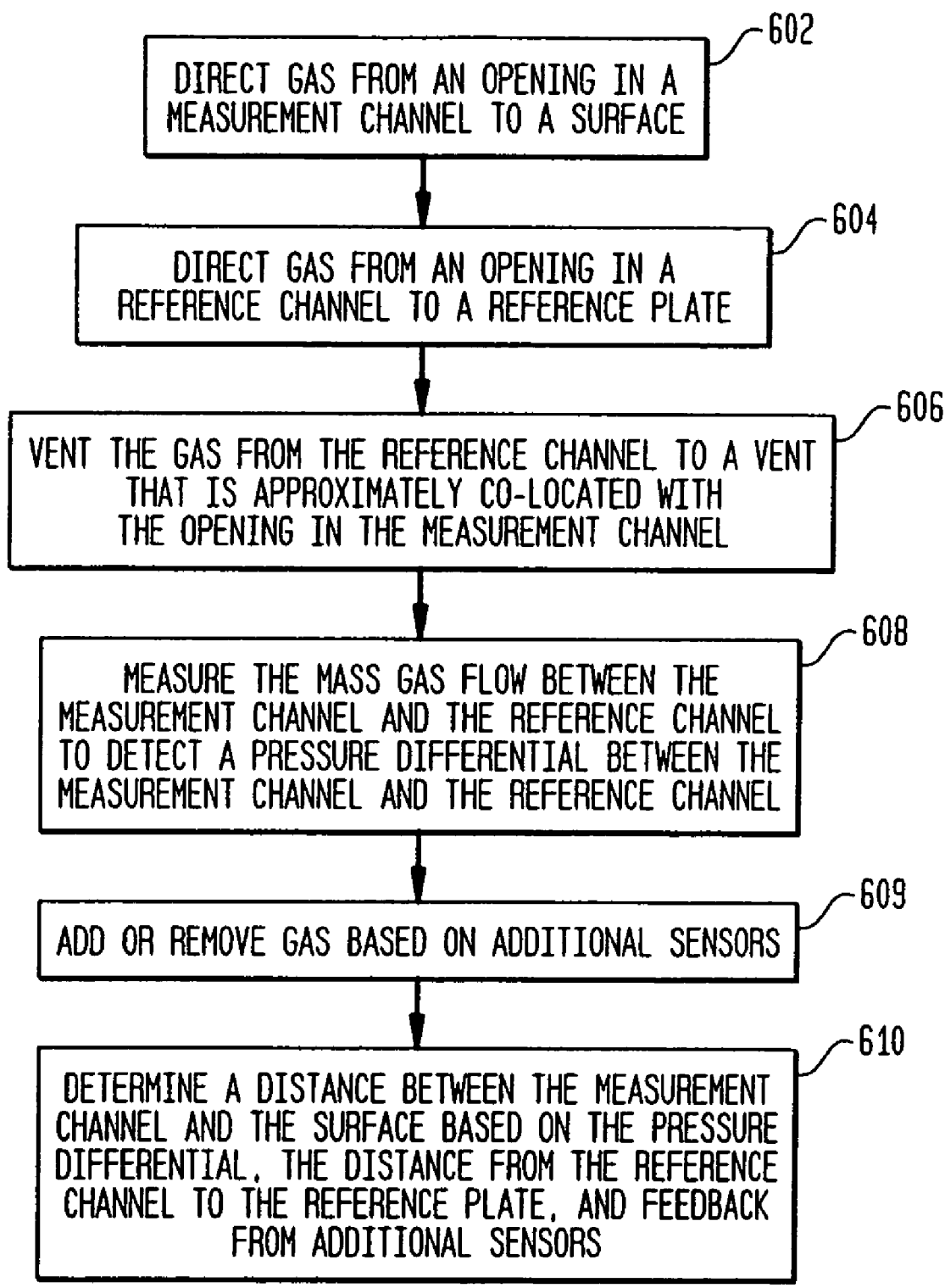
FIG. 6 is a flowchart of a method according to an embodiment of the present invention.

FIG. 6 is a flowchart of a method 600 for measuring distance to a surface according to the present invention. Although method 600 will be described herein with reference to the structure of FIG. 2, one of skill in the art will recognize that method 600 may be used with any gauge implementing the present invention, such as that described in FIG. 3.

In step 602, gas is directed from an opening in a measurement channel to a surface. For example, gas may be directed from measurement nozzle 216, which is an opening in measurement channel 206, toward surface 222.

In step 604, gas is directed from an opening in a reference channel to a reference plate. For example, gas may be directed from reference nozzle 214, which is an opening in reference channel 204, toward reference plate 218.

In step 606, the gas from the reference channel is vented to a vent that is approximately co-located with the opening in the measurement channel. For example, gas from reference channel 204 may be vented through reference chamber 224 having vent 220. Because of the proximity of vent 220 to measurement nozzle 216, any environmental changes at measurement nozzle 216 emanate through reference chamber 224. Thus reference nozzle 214 reacts as though it is co-located with measurement nozzle 216.

In step 608, the mass gas flow between the reference channel and the measurement channel is measured. For example, mass gas flow sensor 212 measures the flow between reference channel 204 and measurement channel 206. This measurement is indicative of a pressure differential between reference channel 204 and measurement channel 206.

In step 609, gas may be added or removed based on additional pressure or flow sensors as well as computation algorithms. The additional pressure or flow sensors may be similar to sensors 324, 326, and 328 shown in FIG. 3. The computational algorithms may be based on the additional sensors and/or an internal air gauge sensor feedback mechanism. The computational algorithms could also be based on experimental results or fluid dynamics theory such as Fanno or Raleigh lines, where choked flow conditions and transitions are attempted to be controlled, much like in supersonic nozzle design. The implementation of these algorithms may result in a closed loop feedback pressure system. The closed loop feedback pressure system may interact with the gas gauge measurement itself. Higher level algorithms may process this information, resulting in the final gauge feedback.

In step 610, a distance between the measurement channel, such as measurement channel 206, and the surface, such as surface 222, is determined. This difference is based on the pressure differential and the distance from the reference channel, such as reference channel 204, to the reference plate, such as reference plate 218. If the distance between the measurement nozzle and the surface is the same as the distance between the reference nozzle and the reference plate, gas directed from the measurement nozzle will hit the surface at the same pressure that gas from the reference nozzle will hit the reference plate. However, if the measurement distance is not substantially equal to the reference distance, gas from the measurement nozzle will not hit the surface at the same pressure as gas from the reference nozzle hits the reference plate. The resulting pressure differential will be detected by the mass flow sensor. Thus, using the pressure differential and the reference distance, the measurement distance can be determined.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for measuring distance to a surface, comprising:
    (a) directing gas from a measurement nozzle located in a measurement channel to said surface;
    (b) directing gas from a reference nozzle located in a reference channel to a reference surface;
    (c) venting said reference nozzle at a position co-located to said measurement nozzle, such that ambient pressure at said reference nozzle is approximately equal to ambient pressure at said measurement nozzle;
    (d) determining a pressure differential between the measurement channel and the reference channel; and
    (e) determining a distance between the measurement nozzle and the surface based on the pressure differential and a fixed distance.

2. The method of claim 1 further comprising directing additional gas or removing gas using a sensor based on computation algorithms to control choked flow conditions or transitions.

3. The method of claim 1 further comprising removing choked flow conditions between said measurement nozzle and reference volume.

4. The method of claim 1, wherein said reference surface comprises a reference plate and is located at a fixed distance from said reference nozzle.

5. The method of claim 1, wherein said gas is argon or nitrogen.

6. A method for measuring distance to a surface within a vacuum, comprising:
    (a) directing gas from a measurement nozzle located in a measurement channel to said surface;
    (b) directing gas from a reference nozzle located in a reference channel to a reference surface;
    (c) venting said reference nozzle at a position co-located to said measurement nozzle, such that ambient pressure at said reference nozzle is approximately equal to ambient pressure at said measurement nozzle;
    (d) injecting or venting gas into one or more annular rings surrounding the measurement and/or reference nozzles to provide an appropriate gas pressure level within the measurement and reference nozzles;
    (e) determining a pressure differential between the measurement channel and the reference channel; and
    (f) determining a distance between the measurement nozzle and the surface based on the pressure differential and a fixed distance.

7. The method of claim 6, wherein said reference surface comprises a reference plate and is located at said fixed distance from said reference nozzle.

8. The method of claim 6, wherein said gas is argon or nitrogen.

* * * * *